May 5, 1970 D. L. TOLLIVER 3,510,728

ISOLATION OF MULTIPLE LAYER METAL CIRCUITS WITH LOW TEMPERATURE PHOSPHORUS SILICATES

Filed Sept. 8, 1967

INVENTOR.
Donald L. Tolliver

BY
Mueller, Aichele & Rauner
Att'ys 3,510,728
ISOLATION OF MULTIPLE LAYER METAL CIRCUITS WITH LOW TEMPERATURE PHOSPHORUS SILICATES Donald L. Tolliver, Phoenix, Ariz., assignor to Motorola, Inc., Franklin Park, Ill., a corporation of Illinois
Filed Sept. 8, 1967, Ser. No. 666,426
Int. Cl. H01l 5/06; H02b 9/00
U.S. Cl. 317—101 3 Claims

ABSTRACT OF THE DISCLOSURE

Multilevel crossover metallization for an integrated circuit structure is provided by a series of steps involving the vapor disposition of phosphorous silicate glass to isolate interconnecting metal conductor layers. A phosphorus silicate insulating layer is formed by exposing a metallized substrate to a gaseous mixture of silane, phosphine and oxygen at approximately 450° C. The ratio of phosphine to silane is selected to provide a glass film having from $10^{18}$ to $10^{21}$ atoms of phosphous per cubic centimeter of silicon, and preferably about $10^{20}$ atoms per cc. based on analysis made by solid state diffusion techniques. The deposition of phosphorus silicate glass to a thickness of about 7000 angstroms proceeds smoothly and rapidly to provide a highly uniform, pinhole-free dielectric film between metal layers.

BACKGROUND

This invention relates to the metallization of microelectronic semiconductor devices, and more particularly to multilevel crossover metallization of monolithic integrated circuits.

The processing of a semiconductor wafer to produce integrated circuit structures generally involves a series of masked diffusion steps in the course of which a layer of semiconductor oxide is formed covering the wafer surface. Following the diffusion steps, a typical metallization sequence begins with the selective etching of windows in the oxide layer to expose the areas where ohmic contacts are to be formed. The wafer is then cleaned and placed in a vacuum evaporation apparatus wherein a thin film of aluminum, for example, is deposited on the entire surface of the wafer. The metal layer is then selectively etched to form a pattern of interconnections between transistors, resistors, diodes and other circuit elements. Also, some metal areas may be left to form dielectric capacitors in conjunction with the underlying substrate.

A single layer of metallization formed in the above manner has been adequate to provide the necessary pattern of connections to accommodate all but the most complex of integrated circuits. In such complex devices, however, where hundreds of components are crowded in a limited area, it has become increasingly apparent that some means must be provided for an insulated crossing of conductive connections. The concept of covering a first metallization pattern with an insulating layer and then forming a second level metallization pattern on the insulating layer has received previous attention in the art. However, the development of a commercially attractive technique for the fabrication of multilayer metallization systems has required a substantial research effort.

In order to be useful as an insulating the material in multiple layer metallization, a glass must satisfy several critical requirements. First of all, the glass must be capable of rapid deposition at low temperatures to form a uniform, pinhole-free film. The maximum temperature which a completed semiconductor structure can tolerate is about 500° C. and preferably it should not be heated above 450° C., in order to avoid the shifting of impurity profiles, with a consequence damaging of PN junctions, and so as not to allow micro alloying to take place between the metal film and exposed semiconductor surfaces. The selection of vapor deposited glasses at such low temperatures is limited because of slow reaction rates and the difficulty of obtaining a uniform, pinhole-free film.

The glass must be physically and chemically compatible with the conductor metal, usually aluminum. Good adherence to the metal and to the oxidized silicon surface is essential, of course, not only during the initial deposition process but also during subsequent temperature cycling. Therefore, it is essential that the glass have a thermal coefficient of expansion which is somewhere between the value for silicon and that of the metal. Chemically, the glass must not react with the metal at normal operating temperatures, and must not be readily penetrated by it.

A further critical problem in the selection of a suitable glass is that of device compatibility. Certain glasses adversely affect the stability of semiconductor device characteristics, presumably due to the buildup of positive charges and/or additional surface states at the glass-semi conductor interface.

A suitable glass must be moisture resistant and also resist penetration by other environmental contaminants, such as sodium ions, for example. It is also apparent that the glass must have a high resistivity, i.e., it must be a good dielectric material.

A preferred glass will have the ability to be readily etched by solutions of hydrofluoric acid or other glass etchants and have etch rates which do not complete with the etch rate of the metal in the same etchant.

From an economic viewpoint it is desirable to use the thinnest possible glass films, consistent with effective insulation of the metal layers. That is, if it were practical to deposite glass films having a thickness of several microins, the selection of a suitable glass would not be so critical. However, since a thin film must be used, preferably thinner than 1 micron, efforts to develop a suitable glass have been particularly challenging.

THE INVENTION

It is therefore an object of the invention to provide an improved integrated circuit device having a plurality of insulated interconnecting metal conductor layers. It is also an object of the invention to provide an improved process for the fabrication of such a device.

More particularly, it is an object of the invention to provide an improved method for the isolation of the interconnecting metal conductor layers on an integrated circuit structure. It is an object to provide a dielectric isolation means having a thermal coefficient of expansion closer to that of silicon and the metal conductor pattern; and to provide a technique for the easily controlled, rapid deposition of highly uniform glass films at low temperatures.

It is a primary feature of the present invention to isolate interconnecting metal conductor layers with a thin film of phosphorus silicate glass.

An additional feature of the invention is to isolate interconnecting metal conductor layers on an integrated circuit with a thin film of phosphorus silicate glass containing from $10^{18}$ to $10^{21}$ atoms of phosphorus per cubic centimeter of silicon, as analyzed by diffusion, and preferably from $1\times10^{20}$ to $5\times10^{20}$ atoms per cc. The preferred thickness of the phosphorus silicate glass film is 6,000 to 7,500 angstroms. Thicker films are useful, but they seldom provide any additional advantage. A thinner film is sometimes useful but 5,000 angstroms is generally as thin as can be used to provide reliable isolation between typical metal thicknesses of 5000 to 7000 angstroms.

An additional feature of the invention is the method of forming a phosphorus silicate glass film to isolate interconnecting metal conductor layers on an integrated circuit by passing a gaseous mixture of silane and phosphine in contact with a metallized integrated circuit structure at a temperature of 350° C. to 500° C.

The invention is embodied in an integrated circuit structure having at least two metal conductor levels separated by a phosphorus silicate glass film.

The invention is further embodied in an integrated circuit structure wherein various circuit components are interconnected by a plurality of metal conductor layers separated by a layer of phosphorus silicate glass at least 5,000 angstroms thick and containing from $10^{18}$ to $10^{21}$ atoms of phosphorus per cubic centimeter.

The invention is further embodied in a method for providing a plurality of interconnecting metal conductor layers on a semiconductor structure to form an integrated circuit. The process includes the steps of forming a first insulating layer on the semiconductor structure, and then selectively etching windows in the insulating layer to expose selected areas of the semiconductor structure for ohmic contacts. A first layer of metal is then deposited on the insulating layer, followed by the steps of selectively removing portions of the first metal layer to provide a desired metallization pattern, then depositing a phosphorus silicate glass to form a second insulating layer covering the metallization pattern.

Windows are selectively etched in the glass to expose desired areas of the structure for ohmic contact, a second layer of metal is deposited on the glass, and portions of the second metal layer are removed to form a desired second level metallization pattern.

When etching the phosphorus silicate glass, a pattern will frequently be selected to provide certain windows extending through both the phosphorus silicate and the first insulating layer to expose the semiconductor surface, and to provide certain other windows which extend through only the phosphorus silicate layer to expose portion of the first metallization layer. Stated otherwise, parts of the second metallization layer will advantageously establish contact with the first metal layer, whereas other portions of the second level metallization will establish contact with selected areas of the semiconductor surface.

It will be apparent that the second metallization may be covered with a second phosphorus silicate glass film, followed by selective etching and the deposition of a third level metallization pattern, and so on repeatedly to form any desired number of metallization layers.

Although the vapor deposition of phosphorus silicate can be carried out with other source compounds, it is preferred to deposit the phosphorus silicate glass films of the invention by passing a gaseous mixture of silane and phosphine in contact with a metallized circuit structure at a temperature of 350° C. to 500° C. While temperatures as low as 275° may sometimes be useful, temperatures higher than 500° C. should not be used because of the danger of seriously degrading device and metal characteristics.

In order to provide ‹ phosphorus silicate glass containing from $10^{18}$ to $10^{21}$ atoms of phosphorus per cubic centimeter of glass, the phosphine and silane in the gaseous mixture charged should also bear essentially the same ratio of phosphorus to silicon. Since the reaction of both the silane and the phosphine is substantially complete, the respective oxides deposit in the same ratio as they are present in the gaseous charge. At 450° C. the deposition rate of phosphorus silicate is approximately 1000 to 2000 angstroms per minute. Therefore, to grow a film about 6000 angstroms thick only 3–6 minutes are required.

Since deposition of the glass can readily be carried out in an open system, atmospheric oxygen will be present in sufficient amounts to completely oxidize the silane and phosphine. If desired, a closer control may be obtained by operation in a closed system with a separate supply of oxygen.

The silane and the phosphine are separately diluted with argon or nitrogen prior to mixing. A useful flow ratio of argon or nitrogen to 100% silane lies within the range of 250 to 500, with 425 being preferred. A ratio of argon or nitrogen to 10% phosphine between 0.7 and 2.5 is useful, with 1.2 being preferred. The flow rate of the silane comprising gas should be 800 to 1000 cc./min. while the flow rate of phosphine-comprising gas is generally maintained at about 80–120 cc./min. Thus the ratio of silane to phosphine charged is between about 100:1 and 200:1, with about 150:1 being preferred. (Note: A system which utilizes 5% silane by volume and 0.1% phosphine by volume also produces the same desired film with entirely different flow rates.)

DRAWINGS

Figure 1:
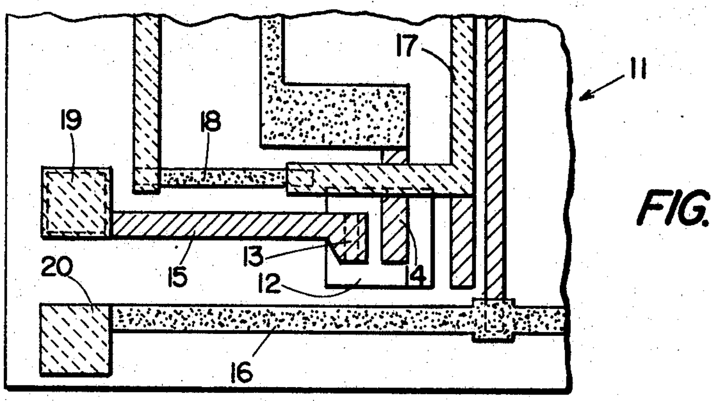
FIG. 1 is a greatly enlarged, fragmented schematic plan view of an integrated semiconductor circuit having three levels of interconnecting metal conductor layers.

FIG. 1 represents a fragmentary portion 11 of an integrated circuit which includes a transistor 12, comprised of base electrode connection 13, and emitter electrode connection 14. Three interconnecting levels of metallization are shown, including first layer 15, second layer, 16, and top layer 17. The layers are separated from each other by intermediate layers of vapor deposited phosphorous silicate glass, in accordance with the present invention, as shown. Other portions of the multilayer structure include resistor element 18 and bonding pads 19 and 20.

Figure 2:
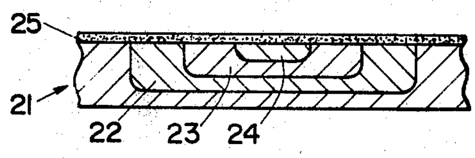
FIGS. 2 through 7 are enlarged cross-sectional views of an integrated circuit structure, illustrating the sequence of steps carried out in accordance with the invention.

FIGS. 2 through 7 illustrate the principal process steps involved in carrying out the method of the invention. FIG. 2 represents a cross section of a semiconductor wafer 21, including a transistor collector region 22, base region 23 and emitter region 24. The entire surface of the wafer is covered by oxide layer 25.

Figure 3:
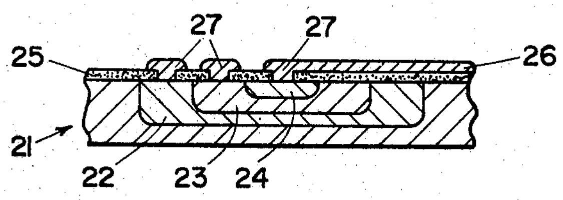

In FIG. 3, oxide layer 25 has been etched to provide windows for ohmic contacts with each of regions 22, 23, and 24, followed by the deposition of a first metallization layer 26, which establishes contact with the respective transistor regions through windows 27 in oxide layer 26.

Figure 4:
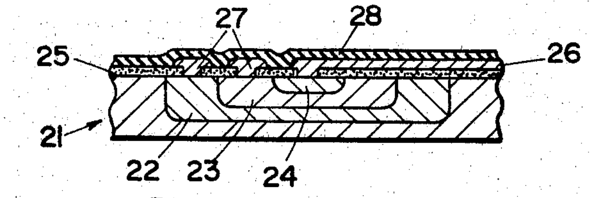
Figure 5:
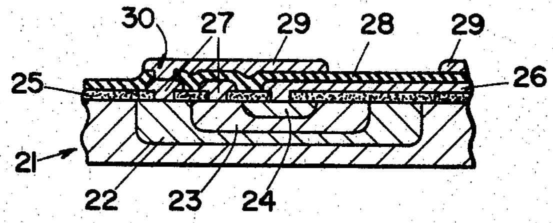

In FIG. 4, the first layer of phosphorus silicate glass 28 has been deposited in accordance with the invention. In FIG. 5, the strusture is represented as it appears after selective etching of glass layer 28 to provide window 30, followed by the deposition of a second metallization layer 29 which makes ohmic contact with the collector region 22, via the collector contact portion of metallization layer 26.

Figure 6:
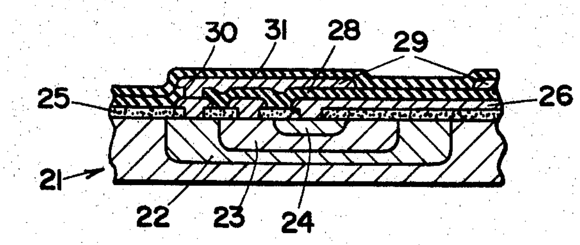

In FIG. 6, a second layer of phosphorus silicate glass 31 has been added which covers all surfaces of the previous structure, including primary metallization 29 and the exposed portion of phosphorus silicate glass layer 28.

Figure 7:
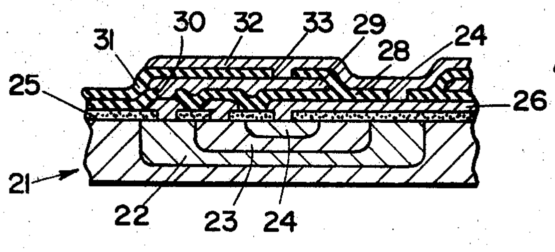

In FIG. 7, glass layer 31 has been selectively etched to provide windows 33 and 34 for the purpose of establishing only contact with metalization layers 29 and 26, respectively. A third metallization layer 32, is then deposited and selectively etched to provide a final pattern which establishes ohmic contact with the underlying metal layers through windows 33 and 34 to complete the final structure.

Systems other than silane plus phosphine may be employed to deposit a phosphorus silicate glass, i.e., tetraethyl ortho-silicate may be charged as a source of silicon, and triethyl phosphorus as a source of phosphorus. Inorganic systems including silicon tetrachloride and phosphorus pentoxide may also be used, and combination of organic and inorganic compounds, although not necessarily with equivalent results.

I claim:

1. An integrated circuit structure comprising a semiconductor body containing a plurality of active circuit components extending to a surface of said body, a first layer of insulating material covering said surface of the semiconductor body, a first conductor pattern on said first insulating layer, said first conductor pattern providing ohmic connections to at least one of said circuit components through one or more apertures in the first insulating layer, a second insulating layer covering said first conductor pattern, and a second conductor pattern on said second insulating layer, said second conductor pattern providing ohmic connections with some portion of the structure through one or more apertures in said second insulating layer, said second insulating layer comprising a phosphorus silicate glass.

2. An integrated circuit structure as defined by claim 1 wherein said glass contains from $1\times10^{20}$ to $5\times10^{20}$ atoms of phosphorus per cubic centimeter of glass.

3. An integrated circuit structure as defined by claim 1 wherein said phosphorus silicate glass insulation is 6,000 to 7,500 angstroms thick.

References Cited

UNITED STATES PATENTS

| | | | |
|---|---|---|---|
| 3,266,127 | 8/1966 | Harding et al. | |
| 3,366,519 | 1/1968 | Pritchard et al. | |
| 3,413,157 | 11/1968 | Kuiper | 148—1.5 |
| 3,419,765 | 12/1968 | Clark et al. | |

OTHER REFERENCES

IBM Technical Disclosure Bulletin, P. D. Davidse, "Phospho-Silicate Glass On Semiconductor Devices," vol. 9, No. 11, April 1967, p. 1645.

IBM Technical Disclosure Bulletin, A. J. Beliveau et al., "Laminated Glass Coatings On Semiconductors Devices," vol. 7, No. 5, October 1964, p. 404.

IBM Technical Disclosure Bulletin, H. R. Gates, "Encapsulation For Semiconductor Devices," vol. 8, No. 11, April 1966.

ROBERT S. MACON, Primary Examiner

J. R. SCOTT, Assistant Examiner

U.S. Cl. X.R.

317—234